United States Patent
Shimoda et al.

(10) Patent No.: US 11,390,829 B2
(45) Date of Patent: Jul. 19, 2022

(54) TREATMENT LIQUID FOR SEMICONDUCTOR WAFERS, WHICH CONTAINS HYPOCHLORITE IONS

(71) Applicant: Tokuyama Corporation, Yamaguchi (JP)

(72) Inventors: Takafumi Shimoda, Yamaguchi (JP);
Takayuki Negishi, Yamaguchi (JP);
Yuki Kikkawa, Yamaguchi (JP); Seiji Tono, Yamaguchi (JP)

(73) Assignee: TOKUYAMA CORPORATION, Yamaguchi (JP)

( * ) Notice: Subject to any disclaimer, the term of this patent is extended or adjusted under 35 U.S.C. 154(b) by 0 days.

(21) Appl. No.: 16/962,260

(22) PCT Filed: Jan. 15, 2019

(86) PCT No.: PCT/JP2019/000938
§ 371 (c)(1),
(2) Date: Jul. 15, 2020

(87) PCT Pub. No.: WO2019/142788
PCT Pub. Date: Jul. 25, 2019

(65) Prior Publication Data
US 2021/0062115 A1 Mar. 4, 2021

(30) Foreign Application Priority Data

Jan. 16, 2018 (JP) .............................. JP2018-005201
Jan. 16, 2018 (JP) .............................. JP2018-005202
Oct. 24, 2018 (JP) .............................. JP2018-199949

(51) Int. Cl.
*C11D 3/395* (2006.01)
*C11D 7/32* (2006.01)
(Continued)

(52) U.S. Cl.
CPC .......... *C11D 7/3209* (2013.01); *C11D 7/5004* (2013.01); *C11D 11/0047* (2013.01); *H01L 21/0209* (2013.01); *H01L 21/02087* (2013.01)

(58) Field of Classification Search
CPC .................................................. C11D 11/0047
(Continued)

(56) References Cited

U.S. PATENT DOCUMENTS 6,468,357 B1 10/2002 Aoki et al.
6,776,919 B2 8/2004 Fukunaga et al.
(Continued)

FOREIGN PATENT DOCUMENTS

JP 2001231373 A 8/2001
JP 2002131381 A 6/2002
(Continued)

OTHER PUBLICATIONS

English Abstract for JP2003119494 A, Apr. 23, 2003.
(Continued)

*Primary Examiner* — Gregory E Webb
(74) *Attorney, Agent, or Firm* — Cahn & Samuels, LLP

(57) ABSTRACT

A treatment liquid for cleaning a semiconductor wafer is a treatment liquid contains (A) a hypochlorite ion and (C) a solvent, in which pH at 25° C. is more than 7 and less than 12.0. A method for removing ruthenium and tungsten from a semiconductor wafer and cleaning the semiconductor wafer includes bringing the treatment liquid into contact with the semiconductor wafer containing ruthenium or tungsten is provided.

15 Claims, 1 Drawing Sheet

(51) Int. Cl.
*C11D 7/50* (2006.01)
*C11D 11/00* (2006.01)
*H01L 21/02* (2006.01)

(58) Field of Classification Search
USPC .......................................................... 510/175
See application file for complete search history.

(56) References Cited

U.S. PATENT DOCUMENTS

| | | |
|---|---|---|
| 7,521,406 B2 | 8/2009 | Hsu |
| 2005/0176603 A1* | 8/2005 | Hsu .................. G03F 7/423 510/175 |
| 2006/0154839 A1* | 7/2006 | Ilardi ................ C11D 3/0073 510/175 |
| 2009/0120458 A1* | 5/2009 | Hao ..................... C11D 7/22 134/2 |
| 2009/0130849 A1 | 5/2009 | Lee |
| 2011/0147341 A1 | 6/2011 | Sato et al. |
| 2014/0076355 A1 | 3/2014 | Hirabayashi et al. |
| 2016/0130500 A1* | 5/2016 | Chen ................. C11D 3/044 216/13 |
| 2021/0155851 A1* | 5/2021 | Ohhashi ............ H01L 21/768 |
| 2021/0155878 A1* | 5/2021 | Shimoda ........... C11D 3/3955 |
| 2021/0180192 A1* | 6/2021 | Sugimura ............. C23F 1/30 |
| 2021/0189235 A1* | 6/2021 | Sugimura ......... H01L 21/308 |

FOREIGN PATENT DOCUMENTS

| | | |
|---|---|---|
| JP | 2003119494 A | 4/2003 |
| JP | 2005227749 A | 8/2005 |
| JP | 2009081247 A | 4/2009 |
| JP | 2013001620 A | 1/2013 |
| JP | 5523325 B2 | 6/2014 |
| TW | 201412977 A | 4/2014 |

OTHER PUBLICATIONS

English Abstract for JP2005227749 A, Aug. 25, 2005.
English Abstract for JP2009081247 A, Apr. 16, 2009.
English Abstract for JP2013001620 A, Jan. 7, 2013.
English Abstract for JP2001231373 A, Aug. 31, 2001.
English Abstract for JP 2002131381 A. Jun. 4, 2002.
English translation of International Search Report, dated Jul. 2019.
English translation of International Preliminary Report on Patentability, dated May 2020.
English Abstract for TW201412977 A, Apr. 1, 2014.
European Patent Office Extended Supplementary Search Report, dated Sep. 10, 2021.

* cited by examiner

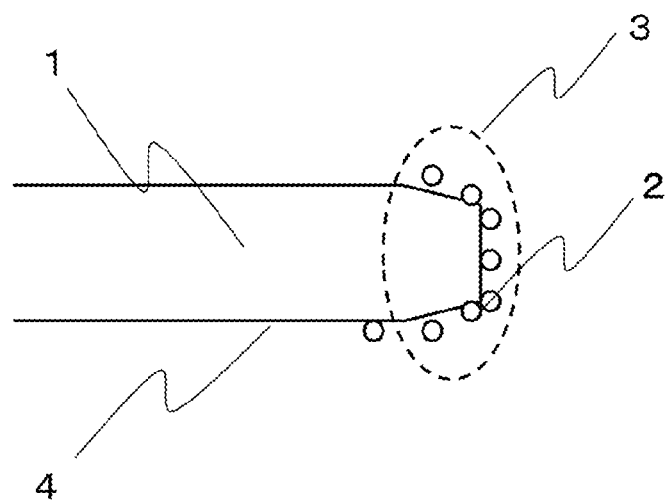

TREATMENT LIQUID FOR SEMICONDUCTOR WAFERS, WHICH CONTAINS HYPOCHLORITE IONS

This application is a U.S. national stage application of PCT/JP2019/000938 filed on 15 Jan. 2019 and claims priority to Japanese patent documents JP 2018-005201 filed on 16 Jan. 2018; JP 2018-005202 filed on 16 Jan. 2018; and JP 2018-199949 filed on 24 Oct. 2018, the entireties of which are incorporated herein by reference.

TECHNICAL FIELD

The present invention relates to a new treatment liquid for cleaning an edge surface portion and a back surface portion of a semiconductor wafer, which is used in steps of manufacturing the semiconductor element.

BACKGROUND OF THE INVENTION

In recent years, miniaturization of a design rule of a semiconductor element has progressed, and a demand for impurity management in steps of manufacturing the semiconductor element has become more severe. Impurities generated in the steps of manufacturing the semiconductor device are different in each manufacturing step. Therefore, it is important to specify a contamination source in each manufacturing step and to manage a concentration of the impurity serving as the contamination source. In particular, since impurities such as metals and metal oxides remain in a manufacturing apparatus, it is important not to bring metals or metal oxides into the next step.

In recent years, in order to improve manufacturing efficiency of a semiconductor element, a semiconductor wafer having a large diameter of more than 300 mm is used. In the semiconductor wafer having a large diameter, an area of an edge surface portion and a back surface portion where no electronic device is produced is larger than that of a semiconductor wafer having a small diameter. Therefore, in a step of forming metal wiring and a step of forming barrier metal, metal wiring materials and barrier metal materials (hereinafter, sometimes collectively referred to as "metal materials") easily adhere to the edge surface portion, the back surface portion, and the like, as well as an element forming portion on the semiconductor wafer surface for forming the semiconductor element. As a result, as the diameter of the semiconductor wafer increases, an amount of excess metal materials adhering to the edge surface portion and the back surface portion of the wafer increases.

The excess metal materials adhering to the edge surface portion and the back surface portion of the semiconductor wafer contaminate the inside of the manufacturing apparatus as particles of metals or metal oxides in an asking step by oxygen or a dry etching step by plasma, which are steps after formation of metal wiring or barrier metal. Thereafter, the particles may adhere to and contaminate other wafers carried into the manufacturing apparatus. The contamination is referred to as cross contamination. In order to reduce the cross contamination, the metal materials adhering to the edge surface portion and the back surface portion of the wafer need to be removed before being brought into the next step.

Among these metal materials, noble metals represented by platinum and ruthenium and tungsten are frequently used in the element forming step. It is known that these metals are difficult to be oxidized, dissolved, and removed in an etching step and a cleaning step thereafter, and continue to be present as impurities. Therefore, these noble metals and tungsten are preferably removed from the semiconductor wafer in preference to other metal materials. In particular, ruthenium is frequently used as a wiring material having a design rule of the semiconductor element of 10 nm or less since a resistance value can be reduced as compared with a case where copper is used as a wiring material, so it is desired to quickly remove ruthenium from an unnecessary place. In addition, although tungsten or a tungsten alloy is frequently used as a material of a gate electrode, wiring, a via hole, or the like, tungsten or the tungsten alloy forms a film by CVD, sputtering, or the like, and therefore also adheres to a place other than a desired place. Therefore, like ruthenium, it is desired to quickly remove tungsten from an unnecessary place.

In general, a method has been proposed in which such noble metals and tungsten are oxidized by a strong oxidant and removed as a compound soluble in water. For example, Patent Literature 1 proposes a cleaning method in which ruthenium is oxidized and removed by further adding a strong acid such as nitric acid to cerium (IV) ammonium nitrate as a cleaning liquid for noble metals.

In Patent Literature 2, a method of cleaning with a liquid having a large oxidability where an oxidation reduction potential as higher than 300 mV or more with respect to a standard hydrogen electrode potential is known as a method for treating ruthenium adhering to an edge surface portion of a semiconductor wafer. Specifically, the liquid is an aqueous sodium hypochlorite solution having a pH of 12 or more or ammonium hypochlorite.

Further, in Patent Literature 3, as a method for etching a ruthenium film, an aqueous sodium hypochlorite solution or an aqueous ortho-periodate solution is used. In this method, ruthenium is etched while supplying benzotriazole in order to prevent corrosion of copper wiring.

In addition to removal of noble metals, in cleaning of a device substrate (semiconductor wafer), as a cleaning liquid where occurrence of a water mark is prevented while preventing corrosion or dissolution of a device material such as wiring, an insulating film, or a capacitive film and contamination such as particles on a substrate can be effectively removed without deteriorating characteristics of the material, Example 5 of Patent Literature 4 proposes a cleaning solution of pH 7 containing hypochlorous acid.

Patent Literature 5 proposes a cleaning composition using tetramethyl ammonium hypochlorite as an oxidant of a cleaning composition for cleaning a photoresist or residues from a microelectronic substrate.

A variety of cleaning liquids for the purpose of etching tungsten are also known. For example, Patent Literature 6 proposes a cleaning liquid containing hydrogen peroxide, an organic acid salt, and water.

CITATION LIST

Patent Literature

Patent Literature 1: Japanese Patent Laid-Open No. 2001-234373
Patent Literature 2: Japanese Patent Laid-Open No. 2002-161381
Patent Literature 3: Japanese Patent Laid-Open No. 2009-081247
Patent Literature 4: Japanese Patent Laid-Open No. 2003-119494
Patent Literature 5: Japanese Patent Laid-Open No. 2005-227749
Patent Literature 6: Japanese Patent No. 5523325

SUMMARY OF INVENTION

Technical Problem

However, according to study of the present inventors, it has been found that the cleaning liquid in the related art has room for improvement in the following respects.

For example, in the method described in Patent Literature 1, ruthenium adhering to the edge surface portion and the back surface portion of the semiconductor wafer is separated as ruthenium oxide, but it has been found that the separated ruthenium oxide does not completely dissolve in the cleaning liquid. Therefore, the separated ruthenium oxide might remain in the manufacturing apparatus and cause cross contamination. Ruthenium oxide may not be removed from the substrate, cleaning of the semiconductor wafer is insufficient, and there is room for improvement.

In addition, it has been found that in the aqueous sodium hypochlorite solution having pH of 12 or more described in Patent Literature 2, oxidation power to ruthenium is insufficient, and an etching speed of ruthenium is slow. Since the etching speed of ruthenium greatly affects productivity particularly in increasing a diameter and a throughput of a semiconductor wafer, there is room for improvement in the aqueous hypochlorous acid solution of Patent Literature 2. In addition, since sodium hypochlorite is used, a sodium ion contained in the cleaning liquid increases. As a result, the sodium ion easily adheres to the semiconductor element, and a yield of the semiconductor element tends to be lowered.

In the cleaning liquid described in Patent Literature 3, a method of etching a ruthenium film with an aqueous sodium hypochlorite solution has been proposed. It is described that fluoric acid cleaning is performed to remove sodium caused by the cleaning liquid after etching. In the fluoric acid cleaning, a semiconductor wafer or a Si oxide coating film may also be etched, and a yield of the semiconductor element may be lowered.

Example 5 of Patent Literature 4 has proposed a cleaning liquid of pH 7 containing hypochlorous acid, and the cleaning liquid is used for cleaning a substrate provided with a metal film or a metal oxide film and aims to prevent occurrence of a water mark, but does not specifically aim to remove noble metals. Therefore, even when an edge surface portion and a back surface portion of the semiconductor wafer were cleaned with a cleaning solution of pH 7 with an oxidation reduction potential adjusted to 612 mV by adding 500 ppm of hypochlorous acid, it is difficult to dissolve and remove ruthenium, and further improvement is necessary. In addition, in the cleaning liquid, although ammonia is used as a pH adjuster and pH of the cleaning liquid is adjusted, ammonia is highly volatile and there is room for improvement in terms of stability of the cleaning liquid. Moreover, since a hypochlorite ion and ammonia react to partially generate trichloramine having high explosive properties, it is difficult to handle the cleaning liquid after pH adjustment.

In the cleaning liquid described in Patent Literature 5, a cleaning liquid containing tetramethyl ammonium hypochlorite is proposed as an oxidant. According to studies by the present inventors, pH of the cleaning liquid is more than 12. For example, a formulation A of Patent literature 5 contains 17.6 mass % of TMAOCl, 6.6 mass % of TMACl, 0.43 mass % of TMAH, 85.3 mass % of water, and 0.05 mass % of zonyl FSH, and has pH of 12.7. However, the cleaning liquid is used for cleaning a photoresist and a residue, and a metal coating of copper, aluminum, or ruthenium is not an object to be cleaned but an object to be protected. Therefore, since the cleaning liquid described in Patent Literature 5 is not a cleaning liquid for the purpose of removing noble metals, there is room for improvement in that the noble metals cannot be removed even if the cleaning liquid described in Patent Literature 5 is used.

The cleaning liquid described in Patent Literature 6 contains hydrogen peroxide and an organic acid salt, and is currently a main stream of an etching liquid for tungsten. The cleaning liquid has a great advantage in that damage to a silicon substrate is small. However, an etching speed to tungsten is not sufficient, and there is a demand for a cleaning liquid where an etching speed to tungsten and the substrate is not damaged in view of improving a throughput.

Accordingly, an object of the present invention is to provide a treatment liquid that can easily remove (clean) excess metal materials adhering to an edge surface portion and a back surface portion of a semiconductor wafer, particularly effective to remove noble metals such as ruthenium or tungsten.

In addition, another object of the present invention is to provide a more improved treatment liquid capable of achieving the above object, reducing an alkali metal ion and an alkaline earth metal ion, and improving a yield of semiconductor elements. In addition to the above, a further object of the present invention is to provide a treatment liquid excellent in storage stability.

In order to solve the above problem, the present inventors have performed intensive studies. It has been studied to use a hypochlorite ion which is an oxidant of noble metals and tungsten. Since a treatment liquid containing merely the hypochlorite ion is not sufficient on a removal effect of noble metals, it has been found that cleanability and storage stability are remarkably improved by setting a pH in an appropriate range after investigating various conditions.

It has been found that the hypochlorite ion can be stabilized, the storage stability can be improved, and an adverse effect caused by the alkali metal ion or the alkaline earth metal ion can be reduced by using an alkyl ammonium ion as a counter cation of the hypochlorite ion. Further, it has been found that even when the alkali metal ion or the alkaline earth metal ion is used as a counter cation of the hypochlorite ion, by setting it to a predetermined concentration range, an adverse effect caused by the alkali metal ion or the alkaline earth metal ion can be reduced without impairing the storage stability.

That is, the present invention relates to a treatment liquid for cleaning a semiconductor wafer, and (1) a treatment liquid according to a first embodiment contains:

(A) a hypochlorite ion; and (C) a solvent, wherein pH at 25° C. is more than 7 and less than 12.0.

According to the treatment liquid of the present invention, ruthenium or tungsten is oxidized by the hypochlorite ion or chlorine. For example, ruthenium is considered to be dissolved as a ruthenium oxide ion ($RuO_4^-$) and removed from the system.

The treatment liquid preferably further contains (B1) an alkyl ammonium ion as an alkali component.

That is, (2) a treatment liquid according to a second embodiment contains:

(A) a hypochlorite ion;

(B1) an alkyl ammonium ion; and (C) a solvent, wherein pH at 25° C. is more than 7 and less than 12.0.

As a mechanism for etching noble metals such as ruthenium, the treatment liquid according to the second embodiment may act as follows. That is, in the presence of the alkyl ammonium ion, it is considered that an activated hypochlorite ion is in contact with ruthenium, and ruthenium is oxidized, ionized, and removed (see Formula 1).

$$2Ru+7ClO^-+2OH^- \Leftrightarrow 2RuO_4^-+7Cl^-+H_2O \quad \text{(Formula 1)}$$

The treatment liquid preferably further contains a specific amount of (B2) at least one metal ion selected from the group consisting of an alkali metal ion and an alkaline earth metal ion as an alkali component.

That is, (3) a treatment liquid according to a third embodiment contains:

(A) a hypochlorite ion;

(B2) at least one metal ion selected from the group consisting of an alkali metal ion and an alkaline earth metal ion; and (C) a solvent, wherein a concentration of the (B2) metal ion is 1 ppm or more and 20,000 ppm or less on a mass basis, and pH at 25° C. is more than 7 and less than 12.0.

Also in the third embodiment, it is considered that ruthenium is oxidized, ionized, and removed as in the second embodiment.

The reaction as described above has been made sure to remarkably proceed when the alkali metal ion and/or the alkaline earth metal ion is in a specific amount, that is, a concentration thereof is 1 ppm or more and 20,000 ppm or less on a mass basis according to studies of the present inventors.

The present invention can also have the following embodiments.

(4) The treatment liquid according to any one of (1) to (3), wherein a concentration of the (A) hypochlorite ion is 0.05 mass % to 20.0 mass %.

(5) The treatment liquid according to (2), wherein the (B1) alkyl ammonium ion is a quaternary alkyl ammonium ion.

(6) The treatment liquid according to (3), wherein the (B2) metal ion is a sodium ion.

(7) A method for cleaning a semiconductor wafer, wherein the treatment liquid according to any one of (1) to (6) is brought into contact with the semiconductor wafer.

(8) The method for cleaning a semiconductor wafer according to (7), wherein the semiconductor wafer has at least one metal selected from the group consisting of ruthenium and tungsten on a surface thereof, and the method includes a step of removing the metal.

(9) A method for manufacturing the treatment liquid according to (2), including:

(a) a step of preparing an ion exchange resin to which alkyl ammonium is added; and (b) a step of bringing the ion exchange resin to which the alkyl ammonium is added into contact with an aqueous solution containing a hypochlorite ion.

(10) The method for manufacturing a treatment liquid according to the above (9), including:

(c) a step of adjusting pH after the (b) step.

The treatment liquid obtained by the method is a treatment liquid in which the alkali metal ion and alkaline earth metal ion derived from a salt of hypochlorite are reduced. For example, when sodium hypochlorite is used, the sodium ion (alkali metal ion) contained in the treatment liquid is reduced. As a result, when the treatment liquid obtained by the method is used, there is no problem caused by the alkali metal ion or alkaline earth metal ion, for example, adhesion of alkali metal to the semiconductor wafer, and a yield of manufacturing the semiconductor element can be improved.

According to the treatment liquid of the present invention, in a case of cleaning a semiconductor wafer on which a metal component containing at least one metal selected from the group consisting of ruthenium and tungsten (hereinafter, abbreviated as "Ru/W") is present, and when cleaning conditions are adjusted, an etching speed of ruthenium is 5 nm/min or more, preferably 10 nm/min or more, and the semiconductor wafer can be cleaned. Further, it is possible to clean the semiconductor wafer in case of the etching speed of tungsten to 50 nm/min or more, preferably 100 nm/min or more.

In the treatment liquid according to the second embodiment, the concentration of a cation (alkali metal ion or alkaline earth metal ion) remaining on a surface of the semiconductor wafer after cleaning can be set to less than $1.5 \times 10^{15}$ atoms/cm$^2$, preferably less than $6.2 \times 10^{14}$ atoms/cm$^2$ by adjusting the conditions.

Furthermore, the treatment liquid according to the second embodiment exhibits an effect of being excellent in long-term storage stability by setting a concentration of the alkyl ammonium ion in addition to pH within a specific range. Since the alkali metal and alkaline earth metal remaining in the manufacturing apparatus and the semiconductor wafer cause a short circuit of an electronic device and lead to a decrease in the yield of the semiconductor element, it is desired to reduce the alkali metal or alkaline earth metal remaining after cleaning.

In the treatment liquid according to the third embodiment, since the concentration of the alkali metal ion and/or the alkaline earth metal ion is 1 ppm or more and 20,000 ppm or less on a mass basis, a sodium ion or the like remaining after cleaning can be reduced, and an effect of being excellent in long-term storage stability is exhibited. In addition, the sodium ion or the like remaining in the manufacturing apparatus and the semiconductor wafer can be reduced. As a result, it is possible to reduce the sodium ion or the like which are considered to cause a short circuit or the like of an electronic device, and thus to improve the yield of the semiconductor element.

Further, according to the treatment liquid of the present invention, only metal (Ru/W) that needs to be removed can be efficiently etched without excessively etching Si which is a main material of the semiconductor wafer or a Si-containing coating film (such as $SiO_2$, $Si_3N_4$, SiOC, and SiC) generated during circuit formation.

BRIEF DESCRIPTION OF DRAWINGS

FIG. 1 is a schematic sectional view showing an example of an edge surface portion of a semiconductor wafer to which the treatment liquid of the present invention can be suitably employed.

DETAILED DESCRIPTION OF THE INVENTION (Treatment Liquid)

The treatment liquid of the present invention can remove noble metals and tungsten adhering to the edge surface portion and the back surface portion without damaging the semiconductor wafer. Therefore, the treatment liquid of the present invention can be suitably used for cleaning the semiconductor wafer where noble metals and tungsten remain on the surface thereof. However, an object to be cleaned is not limited to this, and can be naturally applied to cleaning of the semiconductor wafer having no noble metals or tungsten on the surface thereof.

The metals to which the treatment liquid of the present invention is applied, particularly Ru/W, adhere not only to the surface of the semiconductor wafer but also to the edge surface portion and the back surface portion by CVD and a sputtering method used mainly in the semiconductor element step (see FIG. 1). As shown in FIG. 1, in the semiconductor wafer 1, at least one metal selected from the group consisting of ruthenium and tungsten adheres to the edge surface portion 3 and the back surface portion 4. This tendency becomes significant when a semiconductor wafer having a large diameter such as more than 300 mm is used. In the present invention, the semiconductor wafer having Ru/W on the surface thereof means Ru/W present not only outside a semiconductor element region on the semiconductor wafer surface but also on the edge surface or the back surface.

For example, since Ru/W is used as a material of metal wiring or barrier metal, Ru/W forms a film on silicon constituting the semiconductor wafer or a silicon oxide laminated on silicon.

The treatment liquid of the present invention can be suitably used for cleaning the semiconductor wafer as described above, though it is not particularly limited. The treatment liquid contains (A) a hypochlorite ion and (C) a solvent, preferably contains (B1) an alkyl ammonium ion or (B2) at least one metal ion selected from an alkali metal ion and an alkaline earth metal ion. These will be described in order below.

(A) Hypochlorite Ion

The hypochlorite ion used in the present invention can be generated by dissolving hypochlorite in an applicable solvent such as water. A salt in the hypochlorite is preferably alkali metal and/or alkaline earth metal. Among them, sodium is most preferable in consideration of the cleaning effect.

In the treatment liquid of the present invention, a concentration range of the hypochlorite ion is preferably 0.05 mass % to 20 mass %. Within the above range, Ru/W can be sufficiently dissolved and cleaned. When the concentration of the hypochlorite ion is more than 20 mass %, a decomposition reaction of the hypochlorite ion tends to occur easily. On the other hand, when the concentration is less than 0.05 mass %, the etching speed is slow, and cleanability tends to decrease. Therefore, the range of the concentration of the hypochlorite ion is preferably 0.1 mass % to 15 mass %, more preferably 0.3 mass % to 10 mass %, still more preferably 0.5 mass % to 6 mass %, and particularly preferably 0.5 mass % to 4 mass %.

In the present invention, in order to reduce the decomposition reaction of the hypochlorite ion in the treatment liquid and to reduce the decrease in the hypochlorite ion concentration, pH of the treatment liquid is preferably more than 7 and less than 12. When the pH of the treatment liquid is 7 or less, the decomposition reaction of the hypochlorite ion easily occurs, and the hypochlorite ion concentration tends to decrease easily. Hereinafter, an effect of reducing the decomposition reaction of the hypochlorite ion in the treatment liquid and preventing a decrease in the hypochlorite ion concentration may be referred to as good "storage stability".

Further, in consideration of the storage stability of the treatment liquid, the concentration range of the hypochlorite ion is preferably 0.05 mass % to 6 mass %. Within this range, high storage stability can be ensured. When the concentration of the hypochlorite ion is more than 6 mass %, the decomposition reaction of the hypochlorite ion tends to occur easily. Therefore, in consideration of the etching speed and cleanability of Ru/W and the storage stability of the treatment liquid itself, the concentration range of the hypochlorite ion is more preferably 0.1 mass % to 6 mass %, still more preferably 0.3 mass % to 6 mass %, and particularly preferably 0.5 mass % to 4 mass %.

Therefore, in order to achieve both the etching speed and cleanability of Ru/W and the storage stability of the treatment liquid itself, a treatment liquid having a concentration range of the hypochlorite ion of 0.05 mass % to 6 mass % and pH of more than 7 and less than 12 is particularly preferable. Within the above range, the hypochlorite ion concentration is hard to decrease during storage, for example, it is possible to provide a treatment liquid in which the cleanability of Ru/W is sufficiently exhibited even after 15 days of storage in a dark place at 20° C.

The concentration of the hypochlorite ion can be determined by calculation at the time of manufacturing the treatment liquid and can be confirmed by directly analyzing the treatment liquid. A concentration of the hypochlorite ion described in the following Examples was determined by measuring an effective chlorine concentration of the treatment liquid. Specifically, with reference to the "Ministry of Health, Labor and Welfare Notification No. 318 (Final revision Mar. 11, 2005)", potassium iodide and acetic acid were added to a solution containing a hypochlorite ion and isolated iodine is measured by redox titration with an aqueous sodium thiosulfate solution to calculate the effective chlorine concentration.

(C) Solvent

In the treatment liquid of the present invention, remaining parts other than (A), (B1), (B2), and the other additives to be described in detail below are solvents, and the remaining parts are adjusted with a solvent such that a total amount is 100 mass % after (A), (B1), (B2), and the other additives are adjusted.

As the solvent, water is most preferably used. The water contained in the treatment liquid of the present invention is preferably water where metal ions, organic impurities, particles, and the like are removed by distillation, ion exchange treatment, filter treatment, and various adsorption treatments, particularly preferably pure water or ultra-pure water. In that case, a concentration of water is remaining parts excluding various chemicals.

Further, an organic solvent may be used as long as the hypochlorite ion is stably present. As the organic solvent, for example, acetonitrile and sulfolane are used.

Further, water and the organic solvent may be used in combination as a solvent. By using water and the organic solvent in combination, oxidation of Ru/W proceeds relatively calmly, oxidation of wiring or the like of the circuit forming portion can be reduced, and excess Ru/W adhering to the edge surface portion and the back surface portion of the semiconductor wafer can be efficiently removed. When water and the organic solvent are used in combination, a mass ratio of water to the organic solvent (water/organic solvent) may be about 60/40 to 99.9/0.1.

The treatment liquid of the present invention particularly preferably contains an alkali component. As the alkali component, (B1) an alkyl ammonium ion (second embodiment) or a predetermined amount of (B2) at least one metal ion (third embodiment) selected from an alkali metal ion and an alkaline earth metal ion is used.

(B1) Alkyl Ammonium Ion

The alkyl ammonium ion used in the second embodiment is contained in the treatment liquid to improve the storage stability of the treatment liquid and to adjust the pH.

The alkyl ammonium ion is not particularly limited, and may be any one of a primary alkyl ammonium ion, a secondary alkyl ammonium ion, a tertiary alkyl ammonium ion, and a quaternary alkyl ammonium ion, and may be a mixture thereof. Among these, the quaternary alkyl ammonium ion is preferable in order to further improve ease of manufacturing the treatment liquid itself and a cleaning effect of the treatment liquid.

The number of carbon atoms of the alkyl ammonium ion is not particularly limited. Among these, an alkyl group having 1 to 10 carbon atoms is preferable, and an alkyl group having 1 to 5 carbon atoms is more preferable in order to further improve ease of manufacturing the treatment liquid itself and a cleaning effect of the treatment liquid.

Therefore, as the alkyl ammonium ion, a quaternary alkyl ammonium ion having 1 to 10 carbon atoms, preferably 1 to 5 carbon atoms is preferable. Examples of a specific ion include a tetramethyl ammonium ion, a tetraethyl ammonium ion, and a tetrabutyl ammonium ion. The alkyl ammonium ion does not affect the cleanability of the treatment liquid, and can improve the storage stability of the treatment liquid.

The concentration range of the alkyl ammonium ion is preferably 0.1 mass % to 30 mass %. Since the concentration of the alkyl ammonium ion satisfies the range, even if Ru/W is oxidized, dissolved, and removed, fluctuation in pH of the treatment liquid can be reduced. As a result, etching can be performed stably, and long-term storage stability is also excellent. In order to further exhibit the effect, the concentration of the alkyl ammonium ion is more preferably 0.15 mass % to 20 mass %, more preferably 0.3 mass % to 15 mass %, and particularly preferably 0.5 mass % to 8 mass %.

In addition, the treatment liquid according to the second embodiment may contain an alkali metal ion and an alkaline earth metal ion, such as a sodium ion and a calcium ion that is added to adjust the pH or inevitably introduced in a step of manufacturing the treatment liquid. However, the alkali metal ion and the alkaline earth metal ion may have an adverse effect (such as a decrease in the yield of the semiconductor wafer), a blending proportion thereof is preferably small, and they are desirably not contained. Specifically, the compounding proportion is preferably 1 mass % or less, more preferably 0.7 mass % or less, still more preferably 0.3 mass % or less, particularly preferably 10 ppm or less, and most preferably 500 ppb or less.

The alkyl ammonium ion is present as a counter cation of the hypochlorite ion and stabilizes the hypochlorite ion. Unlike the alkali metal ion and alkaline earth metal ion, there is no adverse effect (such as a decrease in the yield of the semiconductor wafer or the like), which contributes to higher quality of the semiconductor wafer after cleaning.

(B2) At Least One Metal Ion Selected from Alkali Metal Ion and Alkaline Earth Metal Ion The alkali metal ion and/or the alkaline earth metal ion (hereinafter, sometimes simply referred to as "metal ion") used in the third embodiment is preferably derived from a counter ion of the hypochlorite ion in a salt for generating (A) the hypochlorite ion used for production of the treatment liquid itself. Therefore, a type thereof is determined by a raw material to be used. For example, when sodium hypochlorite is used to generate the hypochlorite ion, a sodium ion is present in the treatment liquid. However, it is also possible to prepare a solution that contains a hypochlorite ion and does not contain the metal ion and to add a metal ion thereto.

It should be understood that at least one metal ion selected from the alkali metal ion and the alkaline earth metal ion may be only the alkali metal ion or only the alkaline earth metal ion, or may contain both. When both are contained, a concentration to be described in detail below is based on a total amount of both.

In the third embodiment, the concentration of the metal ion should be 1 ppm or more and 20,000 ppm or less on a mass basis. Within the above range, even if ruthenium is oxidized, dissolved or removed, the pH of the treatment liquid does not fluctuate, and etching can be performed stably. Further, within the above range, a treatment liquid having excellent long-term storage stability can be obtained.

That is, when the concentration of the metal ion is less than 1 ppm on a mass basis, a ratio of counter ion to be paired with the hypochlorite ion decreases, and decomposition of the hypochlorite ion is accelerated. On the other hand, when the concentration of the metal ion is more than 20,000 ppm on a mass basis, since there are many metal ions to be counter ions, the hypochlorite ion can be stably present, but the surface of the semiconductor wafer after cleaning is contaminated with metal ion. Therefore, a decrease in the yield of the semiconductor element is caused. In the treatment liquid according to the third embodiment, by adjusting a blending amount thereof, only sodium (metal ion) of less than $1 \times 10^{15}$ atoms/cm$^2$ can remain on the cleaned surface of the semiconductor wafer. As a result, it can be suitably used as a cleaning liquid of the back surface portion and the edge surface portion of the semiconductor wafer.

In consideration of the storage stability and the cleaning effect of the treatment liquid, the concentration of the metal ion is 1 ppm or more and 20,000 ppm or less, preferably 10 ppm or more and 15,000 ppm or less, more preferably 200 ppm or more and 13,000 ppm or less, and even more preferably 1,000 ppm or more and 10,000 ppm or less on a mass basis. Within the above range, even if Ru/W is removed (cleaned), the pH of the treatment liquid does not fluctuate, and treatment can be performed stably.

When the metal ion contained in the treatment liquid as a counter ion of the hypochlorite ion is too much and it is necessary to reduce the metal ion, the treatment liquid may be prepared so as to satisfy requirements of the present invention by employing the following method. Specifically, a method of dissolving sodium hypochlorite in water and then bringing it into contact with a cation exchange resin to replace a sodium ion with a hydrogen ion can be employed. When reduction of the metal ion is insufficient, the metal ion can be reduced by repeatedly performing an operation of contacting with the cation exchange resin.

In order to adjust the pH of the treatment liquid according to the third embodiment and to improve storage stability thereof, amines, preferably an organic amine, can also be blended. The organic amine is not particularly limited as long as it is an amine such as an ammonium ion or an alkyl ammonium ion. Among these, an organic amine which is a quaternary alkyl ammonium ion is preferable. The number of carbon atoms of the quaternary alkyl ammonium ion is not particularly limited, and the alkyl group preferably has 1 to 10 carbon atoms, particularly preferably 1 to 5 carbon atoms, and specifically preferred are a tetramethyl ammonium ion, a tetraethyl ammonium ion, and a tetrabutyl ammonium ion. In the third embodiment, when amines are blended, it is preferable to blend with an amount satisfying that the pH of the treatment liquid is in a range of more than 7 and 10.0 or less. However, the amines are not an essential component. Since the treatment liquid according to the third embodiment contains a specific amount of metal ions, excellent effects are exhibited although amines are not contained. The metal ions can be produced directly from an aqueous hypochlorite solution by adjusting manufacturing conditions. Therefore, in consideration of ease of manufacture of the treatment liquid, a specific amount of metal ions are preferably contained.

(Other Additives)

The treatment liquid of the present invention may contain an additive conventionally used in a treatment liquid for a semiconductor as long as the object of the present invention is not impaired. For example, as the additive, an acid, a metal corrosion inhibitor, a fluorine compound, an oxidant, a reductant, a chelating agent, a surfactant, an antifoaming agent, and the like can be added.

(PH of Treatment Liquid)

The treatment liquid of the present invention contains the (A) hypochlorite ions and the (C) solvent, preferably contains the (B1) alkyl ammonium ion or a predetermined amount of the (B2) metal ion, and contains other additives as necessary. In a case of a suitable (A) hypochlorite ion concentration (0.05 mass % to 20 mass %) and a suitable (B1) alkyl ammonium ion concentration (0.1 mass % to 30 mass %) or (B1) metal ion concentration (1 ppm or more and 20,000 ppm or less), the pH of the treatment liquid can be easily set to more than 7 and less than 12. Since the pH of the treatment liquid of the present invention is more than 7 and less than 12 by the amount of each component, the pH of the treatment liquid does not fluctuate even if Ru/W is oxidized, dissolved, and removed, and Ru/W can be stably removed. Further, within the above range, a treatment liquid having excellent long-term storage stability can be obtained. When the pH of the treatment liquid is 12 or more, the etching speed of Ru/W is significantly reduced.

When the pH of the treatment liquid is 7 or less, the decomposition reaction of the hypochlorite ion contained in the treatment liquid tends to easily occur. Therefore, in consideration of use of a stable treatment liquid and the storage stability of the treatment liquid itself, the pH of the treatment liquid is more preferably 8 or more and less than 12, and still more preferably 8 or more and less than 11.

A method for manufacturing the treatment liquid of the present invention is not particularly limited. The treatment liquid according to the first embodiment can be produced according to a method for manufacturing the treatment liquid according to the second or third embodiment. Hereinafter, the methods of manufacturing the treatment liquid according to the second and third embodiments will be described by taking a case where water is used as a solvent as an example.

(Method for Manufacturing Treatment Liquid According to Second Embodiment)

The treatment liquid according to the second embodiment can be produced by preparing an ion exchange resin to which alkyl ammonium is added and bringing an aqueous solution containing a hypochlorite ion into contact with the ion exchange resin.

Hereinafter, each step will be described in detail.

(a) Step of Preparing Ion Exchange Resin to which Alkyl Ammonium is Added

An aqueous solution containing an alkyl ammonium ion or a halogenated alkyl ammonium ion, specifically an aqueous alkyl ammonium hydroxide solution, is brought into contact with the ion exchange resin to prepare an ion exchange resin to which alkyl ammonium is added.

The alkyl ammonium added to the ion exchange resin is not particularly limited, and may be any one of primary alkyl ammonium, secondary alkyl ammonium ion, tertiary alkyl ammonium, and quaternary alkyl ammonium, and may be a mixture thereof. However, as described above, the alkyl ammonium ion contained in the treatment liquid is preferably a quaternary alkyl ammonium ion. Therefore, the alkyl ammonium is preferably quaternary alkyl ammonium. Like the quaternary alkyl ammonium ion, the alkyl group of the quaternary alkyl ammonium has preferably 1 to 10 carbon atoms, more preferably 1 to 5 carbon atoms. Specific examples of the compound include tetramethyl ammonium hydroxide. Therefore, in the present embodiment, the ion exchange resin to which the alkyl ammonium is added is preferably prepared by bringing the aqueous tetramethyl ammonium hydroxide solution into contact with the ion exchange resin.

The ion exchange resin to be used is not particularly limited as long as it is a known cation exchange resin. For example, a hydrogen type ion exchange resin or a sodium type ion exchange resin can be used. However, in a case of the sodium type ion exchange resin, since sodium is contained in the obtained treatment liquid, a hydrogen type ion exchange resin is preferable. The hydrogen type ion exchange resin can be a weakly acidic type or strongly acidic type.

(b) Step of Bringing Alkyl Ammonium Type Ion Exchange Resin into Contact with Aqueous Solution Containing Hypochlorite Ion After the preparation of the ion exchange resin to which the alkyl ammonium is added, then an aqueous solution containing a hypochlorite ion is brought into contact with the ion exchange resin, so that the treatment liquid of the present embodiment can be manufactured.

The aqueous solution containing a hypochlorite ion can be prepared by dissolving hypochlorite in water. Examples of the hypochlorite include calcium hypochlorite and sodium hypochlorite, but sodium hypochlorite is preferable in that storage stability and handling are good.

By bringing the aqueous solution containing the prepared hypochlorite ion into contact with the ion exchange resin to which the alkyl ammonium is added, a treatment liquid containing a hypochlorite ion and an alkyl ammonium ion can be manufactured.

In the present embodiment, the step ion exchange of (b) may be repeated. By repeating the ion exchange step, a cation which is a counter ion of hypochlorite ion contained in the aqueous solution, for example, sodium or calcium can be reduced. As described above, an alkali metal ion and an alkaline earth metal ion such as sodium or calcium contained in the treatment liquid cause a decrease in the yield of the semiconductor element. Therefore, as described above, a total of the alkali metal ion and the alkaline earth metal ion contained in the treatment liquid is 1 mass % or less, preferably 0.7 mass % or less, more preferably 0.3 mass % or less, still more preferably 10 ppm or less, and particularly preferably 1 ppm or less. When the treatment liquid of the present invention is applied to a manufacturing step in which a design rule of the semiconductor element is 10 nm or less, an alkali metal ion and an alkaline earth metal ion at a level of 10 ppm affect the yield of the semiconductor element, and therefore a level of 500 ppb or less is preferable. By repeating the (b) step, the total amount of the alkali metal ion and the alkaline earth metal ion contained in the treatment liquid can be reduced as much as possible.

After the (b) step, the other optional additive may be mixed with the obtained solution (treatment liquid).

Although the method for manufacturing the treatment liquid according to the second embodiment has been described above, for example, the treatment liquid of the present invention may be manufactured by bringing the aqueous solution containing a hypochlorite ion into contact with the ion exchange resin and mixing an aqueous solution containing a hypochlorite ion in which an alkali metal or an alkaline earth metal ion is reduced with an aqueous solution containing an alkyl ammonium ion. It is also possible that the treatment liquid of the present invention may be manufactured by bringing an aqueous solution containing a hypochlorite ion in which a cation is reduced into contact with the ion exchange resin to which alkyl ammonium is added.

However, in a step of manufacturing an aqueous solution containing a hypochlorite ion in which an alkali metal ion or an alkaline earth metal ion is reduced from the aqueous solution containing a hypochlorite ion, if pH of the aqueous solution becomes acidic, the decomposition reaction of the hypochlorite ion starts and storage stability decreases. Therefore, such manufacturing method that an ion exchange resin to which alkyl ammonium is added is prepared and the aqueous solution containing a hypochlorite ion is brought into contact with the ion exchange resin is preferable, since the hypochlorite ion in the manufacturing step is not decomposed, and the treatment liquid of the present invention can be stably manufactured.

(c) Step of Adjusting pH

In manufacture of the treatment liquid according to the second embodiment, a step (c) of adjusting pH after the (b) step can be included. In adjustment of the pH of the treatment liquid, the pH of the treatment liquid can be reduced (adjusted to acidic) by allowing the treatment liquid obtained in the (b) step to pass through a hydrogen type cation exchange resin or to add an acid such as hydrochloric acid. In addition, the pH of the treatment liquid can be raised (adjusted to alkaline) by allowing the treatment liquid obtained in the (b) step to pass through a hydroxide type anion exchange resin or to add an alkyl ammonium hydroxide solution such as a tetramethyl ammonium hydroxide solution.

(Method for Manufacturing Treatment Liquid According to Third Embodiment)

The treatment liquid according to the third embodiment can be manufactured by reducing a metal ion, which is a counter ion of a hypochlorite ion from an aqueous hypochlorite solution.

As a method for reducing the metal ion, a method of bringing the ion exchange resin into contact with the hypochlorite and substituting the metal ion with a hydrogen ion may be employed.

Specifically, first, sodium hypochlorite is dissolved in water to prepare an aqueous solution containing a hypochlorite ion, and the solution is brought into contact with the cation exchange resin. By adsorbing the metal ion contained in the aqueous solution containing a hypochlorite ion to the ion exchange resin and adjusting a metal ion concentration (1 ppm or more and 20,000 ppm or less), the treatment liquid according to the third embodiment can be manufactured.

The ion exchange resin is not particularly limited and can be used as long as it is a cation exchange resin such as a strongly acidic ion exchange resin or a weakly acidic ion exchange resin. When the weakly acidic ion exchange resin is brought into contact with the aqueous sodium hypochlorite solution, swelling of the ion exchange resin is small and chlorine is not generated, so that the weakly acidic ion exchange resin is more preferable in that handling is excellent.

The method of bringing the cation exchange resin into contact with the aqueous sodium hypochlorite solution is not particularly limited, and a known method may be employed. Specifically, a method comprises a step of passing the aqueous sodium hypochlorite solution to a column packed with the cation exchange resin.

In addition, the ion exchange resin may be regenerated as necessary. A method for regenerating the ion exchange resin is not particularly limited, and a known method may be employed. Specifically, it is a method in which hydrochloric acid or sulfuric acid passes through the column packed with a cation exchange resin after passing the aqueous sodium hypochlorite solution.

After the above step, a step of adjusting the pH of the treatment liquid may be included in the same manner as in the second embodiment.

(Storage Method)

A method for storing the treatment liquid of the present invention is not particularly limited, but the treatment liquid is preferably stored at 20° C. or lower since the decomposition of a hypochlorite ion increases as temperature rises. In addition, since the hypochlorite ion decomposes by ultraviolet rays, the hypochlorite ion is preferably stored in a dark place. By applying such a storage condition, the storage stability of the treatment liquid can be further improved.

(Method for Cleaning Semiconductor Wafer)

Cleaning conditions using the treatment liquid of the present invention may be appropriately selected according to cleaning conditions of a cleaning apparatus to be used, usually temperature is in a range of 10° C. to 80° C., preferably 20° C. to 70° C.

The etching speed of Ru/W changes with the cleaning temperature. Therefore, to improve cleanability of Ru/W, temperature during cleaning is 50° C. to 70° C. within the above temperature range. In the temperature range of 50° C. to 70° C., the etching speed can be increased, and treatment can be performed with good operability with a simple apparatus. For example, it is known that the cleanability is different even when the same cleaning conditions are selected in a case of cleaning in a single-wafer type and in a case of cleaning in a batch type. Therefore, when the cleanability of Ru/W is insufficient according to the type of the cleaning apparatus, the cleaning conditions, the cleaning temperature may be raised appropriately.

Time for using the treatment liquid of the present invention is in a range of 0.1 to 120 minutes, preferably 0.5 to 60 minutes, and may be appropriately selected by etching conditions or a semiconductor element to be used. An organic solvent such as alcohol can be used as a rinse liquid after the treatment liquid of the present invention is used, but it is sufficient to rinse only with deionized water.

As described above, the treatment liquid of the present invention can efficiently etch Ru/W. The etching speed of ruthenium can be set to 5 nm/min or more, preferably 10 nm/min or more. The etching speed of tungsten can be set to 50 nm/min or more, preferably 100 nm/min or more. Further, a remaining amount of metal (for example, sodium) can be reduced to a level of less than $1.0 \times 10^{15}$ atoms/cm$^2$, preferably less than $6.2 \times 10^{14}$ atoms/cm$^2$ on the surface of the semiconductor wafer after cleaning. In addition, if the conditions are adjusted, the etching speed (removal speed) of Ru/W after cleaning can be sufficiently increased, and a metal residue can be further reduced. As is clear from this, the treatment liquid of the present invention can be suitably used in a method for manufacturing a semiconductor element including a step of removing Ru/W adhering to the edge surface portion and the back surface portion of the semiconductor wafer.

EXAMPLES

Hereinafter, the present invention will be described more specifically by Examples, but the present invention is not limited to these Examples.

(Method for Measuring pH)

30 mL of the treatment liquid prepared in Examples and Comparative Examples was subjected to pH measurement using a desktop pH meter (LAQUA F-73, manufactured by HORIBA, Ltd.). The pH measurement was performed after preparing the treatment liquid and stabilizing it at 25° C.

(Method for Calculating Effective Chlorine Concentration and Hypochlorite Ion Concentration)

After preparing the treatment liquids of Examples and Comparative Examples, 0.5 mL of the treatment liquid, 2 g of potassium iodide (Wako Pure Chemical Industries, Ltd., special grade reagent), 8 mL of 10% acetic acid, and 10 mL of ultrapure water were added to a 100 mL conical flask and stirred until a solid material was dissolved to obtain a brown solution. The prepared brown solution was subjected to redox titration with a 0.02 M sodium thiosulfate solution (manufactured by Wako Pure Chemical Industries, Ltd., for volumetric analysis) until a color of the solution became very pale yellow from brown, and then a starch solution was added to obtain a pale purple solution. The 0.02 M sodium thiosulfate solution was further added to the solution, and a point where the solution became colorless and transparent was taken as an end point to calculate an effective chlorine concentration. A hypochlorite ion concentration was calculated from the obtained effective chlorine concentration. For example, when the effective chlorine concentration is 1%, the hypochlorite ion concentration is 0.73%.

(Method for Calculating Sodium Ion Concentration)

After preparing the treatment liquids of Examples and Comparative Examples, high-frequency inductively coupled plasma emission spectroscopy (iCAP 6500 DuO, manufactured by Thermo SCIENTIFIC) was used to analyze a Na concentration.

(Method for Calculating Alkyl Ammonium Ion Concentration)

The alkyl ammonium ion concentration in the treatment liquids of Examples and Comparative Examples was determined by calculation from the pH, the hypochlorite ion concentration, and the sodium ion concentration.

(Method for Calculating Etching Speed of Ru/W)

An oxide film was formed on a silicon wafer using a batch type thermal oxidation furnace, and ruthenium or tungsten film having a thickness of 120 nm (±10%) on the oxide film using a sputtering method. Sheet resistance was measured by a four-probe resistance measuring instrument (Loresta-GP, manufactured by Mitsubishi Chemical Analytech) and converted into a film thickness.

30 ml of the treatment liquids having compositions of Examples and Comparative Examples were prepared in a fluororesin container with a lid (manufactured by AS ONE Corporation, PFA container 94.0 mL), and each sample piece of 10 mm×20 mm was immersed in the treatment liquid at 23° C. for one minute, and a value obtained by dividing a film thickness variation amount before and after the treatment with an immersion time was calculated as an etching speed at 23° C. Further, the fluorine resin container with a lid which contains 30 mL of the treatment liquid was placed in a water bath (Water bath with an Isotemp universal hood manufactured by ThermoFisher Scientific) heated to 65° C. for one hour, then each sample piece of 10 mm×20 mm was immersed in the treatment liquid at 65° C. for one minute, and a value obtained by dividing the film thickness variation amount before and after the treatment by the immersion time was calculated as the etching speed and evaluated the etching speed in the present invention.

After completely etching the ruthenium film, the surface of the a silicon wafer was observed with a microscope of 20,000 times. A case where some foreign matter was observed at this time was ranked as poor (B), and a case where no foreign matter was confirmed was ranked as good (A). Although the origin and composition of the foreign matter is unclear, it is considered that any component eluted in the treatment liquid re-adheres to the wafer surface. When the Ru etching speed is extremely slow, removal of a Ru film takes time, so that the foreign matter is not evaluated.

(Method for Evaluating Concentration of Sodium Remaining on Cleaning Surface of Wafer)

Each sample piece cut into 10 mm×20 mm is immersed in 30 mL of the treatment liquids of Examples and Comparative Examples for one minute. Four rinse liquids containing 30 mL of ultrapure water in a fluororesin container were prepared in advance, and a total of four times of rinsing operation were performed by immersing the sample in the rinse liquid for one minute while shaking, and then a concentration of Na contained in the fourth rinse liquid was analyzed using high-frequency inductively coupled plasma emission spectroscopy (iCAP 6500 DuO, manufactured by Thermo SCIENTIFIC). When a concentration of residual Na is more than $1.0 \times 10^{15}$ atoms/cm$^2$, Na may remain on the semiconductor element surface, and the yield of the semiconductor device may be significantly reduced. A quantification lower limit (detection limit value) of the present measurement method was less than $6.2 \times 10^{14}$ atoms/cm$^2$. An evaluation result by this measurement is an index indicating tendency that sodium contained in the treatment liquid remain on the wafer when the semiconductor wafer is cleaned using the treatment liquid. Even when the concentration of residual Na is more than $1.0 \times 10^{15}$ atoms/cm$^2$, the concentration of residual Na can be reduced by repeated washing.

Evaluation was made on the following criteria.

A: less than $6.2 \times 10^{14}$ atoms/cm$^2$
B: $6.2 \times 10^{14}$ atoms/cm$^2$ or more and less than $1.0 \times 10^{15}$ atoms/cm$^2$
C: $1.0 \times 10^{15}$ atoms/cm$^2$ or more (Method for Evaluating Storage Stability)

30 mL of the treatment liquids of Examples and Comparative Examples were housed in a fluororesin container and stored in a dark place at 20° C. for 15 days. After 15 days of storage, an effective chlorine concentration of the treatment liquid was measured and converted into the hypochlorite ion concentration. Hypochlorite ion concentrations immediately after manufacture and after 15 days of storage were compared, and a ratio thereof (immediately after manufacture/after 15 days) of 0.5 or more and 1.0 or less was ranked as good (A), and a ratio of less than 0.5 was ranked as poor (B).

Example 1

(Manufacture of Treatment Liquid)
<Pre-Treatment of Ion Exchange Resin to Prepare Hydrogen Type Ion Exchange Resin>
200 mL of a strongly acidic ion exchange resin (manufactured by Organo Corporation, Amberlite IR-120 BNa)

was charged into a glass column having an inner diameter of about 45 mm (manufactured by AS ONE Corporation, Biocolumn CF-50 TK). Thereafter, 1 L of 1 equivalent concentration of hydrochloric acid (manufactured by Wako Pure Chemical Industries, Ltd., for volumetric analysis) passed through an ion exchange resin column to exchange the resin into a hydrogen type, and 1 L of ultrapure water was passed for washing the ion exchange resin.

<(a) Step>

Further, 1 L of a 10% tetramethyl ammonium hydroxide solution passed through 209 mL of an ion exchange resin of 2 meq/mL-R exchanged into a hydrogen type, and the ion exchange resin was ion-exchanged from a hydrogen type to a tetramethyl ammonium (TMA) type. After the ion exchange, 1 L of ultrapure water was passed to wash the ion exchange resin.

<(b) Step>

69 g of sodium hypochlorite pentahydrate (manufactured by Wako Pure Chemical Industries, Ltd., special grade reagent) was put in a 2 L of fluororesin container, and 931 g of ultrapure water was added to prepare 3.11 mass % of an aqueous sodium hypochlorite solution. 1 L of the prepared aqueous sodium hypochlorite solution passed through the ion exchange resin exchanged into a tetramethyl ammonium type to obtain a treatment liquid having composition described in Table 2.

<Evaluation>

The pH, effective chlorine concentration, and hypochlorite ion concentration of the obtained treatment liquid were evaluated, and the alkyl ammonium ion concentration, sodium ion concentration, ruthenium etching speed, tungsten etching speed, residual of foreign matter, "sodium concentration remaining on the cleaning surface of the wafer", and storage stability were evaluated. The results are shown in Table 3.

Example 2

The same operation as in Example 1 was repeated except that the amount of the ion exchange resin in the (a) step was 282 mL and the concentration of the aqueous sodium hypochlorite solution in the (b) step was 4.20 mass % to obtain a treatment liquid having the composition described in Table 2. Evaluation results are shown in Table 3.

Example 3

The same operation as in Example 1 was repeated except that the amount of the ion exchange resin in the (a) step was 141 mL and the concentration of the aqueous sodium hypochlorite solution in the (b) step was 2.10 mass % to obtain a treatment liquid having the composition described in Table 2. Evaluation results are shown in Table 3.

Example 4

The same operation as in Example 1 was repeated to obtain a treatment liquid, and then the treatment liquid passed through a glass column filled with 50 mL of a cation exchange resin of 2 meq/mL-R exchanged into a hydrogen type as a pH adjustment step (c) to obtain a treatment liquid having the composition described in Table 2. Evaluation results are shown in Table 3.

Example 5

The same operation as in Example 1 was repeated to obtain a treatment liquid, and then a 25% tetramethyl ammonium hydroxide (TMAH) solution was added to the treatment liquid until the pH became 11.5 as a pH adjustment step (c) to obtain a treatment liquid having the composition described in Table 2. Evaluation results are shown in Table 3.

Example 6

The same operation as in Example 1 was repeated except that the amount of the ion exchange resin in the (a) step was 31 mL and the concentration of the aqueous sodium hypochlorite solution in the (b) step was 0.46 mass % to obtain a treatment liquid having the composition described in Table 2. Evaluation results are shown in Table 3.

Example 7

The same operation as in Example 1 was repeated except that the amount of the ion exchange resin in the (a) step was 564 mL, a passing amount of 10% tetramethyl ammonium hydroxide solution was 2 L, and the concentration of the aqueous sodium hypochlorite solution in the (b) step was 8.39 mass % to obtain a treatment liquid having the composition described in Table 2. Evaluation results are shown in Table 3.

Example 8

The same operation as in Example 1 was repeated except that the amount of the ion exchange resin in the (a) step was 705 mL, a passing amount of 10% tetramethyl ammonium hydroxide solution was 2 L, and the concentration of the aqueous sodium hypochlorite solution in the (b) step was 10.49 mass % to obtain a treatment liquid having the composition described in Table 2. Evaluation results are shown in Table 3.

Example 9

Sodium hypochlorite pentahydrate (manufactured by Wako Pure Chemical Industries, Ltd., special grade reagent) was dissolved in water such that the hypochlorite ion was 2.15 mass % to obtain a treatment liquid having the composition described in Table 2. Evaluation results are shown in Table 3.

Comparative Example 1

The same operation as in Example 1 was repeated to obtain a treatment liquid, and then the treatment liquid passed through a glass column filled with 203 mL of a cation exchange resin of 2 meq/mL-R exchanged into a hydrogen type as a pH adjustment step (c) to obtain a treatment liquid having the composition described in Table 2. Evaluation results are shown in Table 3.

Comparative Example 2

The same operation as in Example 1 was repeated to obtain a treatment liquid, and then the treatment liquid passed through a glass column filled with 208 mL of a cation exchange resin of 2 meq/mL-R exchanged into a hydrogen type as a pH adjustment step (c) to obtain a treatment liquid having the composition described in Table 2. Evaluation results are shown in Table 3.

Comparative Example 3

The same operation as in Example 1 was repeated to obtain a treatment liquid, and then the treatment liquid passed through a glass column filled with 209 mL of a cation exchange resin of 2 meq/mL-R exchanged into a hydrogen type as a pH adjustment step (c) to obtain a treatment liquid having the composition described in Table 2. Evaluation results are shown in Table 3.

Comparative Example 4

The same operation as in Example 1 was repeated to obtain a treatment liquid, and then a 25% tetramethyl ammonium hydroxide solution was added to the treatment liquid until the pH became 13.0 as a pH adjustment step (c) to obtain a treatment liquid having the composition described in Table 2. Evaluation results are shown in Table 3.

Table 1 shows main conditions in the manufacturing steps of Examples and Comparative Examples, Table 2 shows composition of each treatment liquid, and Table 3 shows the evaluation results.

TABLE 1

| | (a) step Preparation of TMA type ion exchange resin | | (b) step Through solution of NaClO | | (c) step pH adjustment | |
|---|---|---|---|---|---|---|
| | Fillng amount of resin [mL] | 10% TMAH solution passing amount [L] | Concentration of NaClO [mass %] | NaClO solution passing amount [L] | Fillng amount of H type resin [mL] | TMAH addition |
| Example 1 | 209 | 1 | 3.11 | 1 | — | — |
| Example 2 | 282 | 1 | 4.2 | 1 | — | — |
| Example 3 | 141 | 1 | 2.1 | 1 | — | — |
| Example 4 | 209 | 1 | 3.11 | 1 | 50 | — |
| Example 5 | 209 | 1 | 3.11 | 1 | — | addition until pH 11.5 |
| Example 6 | 31 | 1 | 0.46 | 1 | — | — |
| Example 7 | 564 | 2 | 8.39 | 1 | — | — |
| Comparative Example 1 | 209 | 1 | 3.11 | 1 | 203 | — |
| Comparative Example 2 | 209 | 1 | 3.11 | 1 | 208 | — |
| Example 8 | 705 | 2 | 10.49 | 1 | — | — |
| Comparative Example 3 | 209 | 1 | 3.11 | 1 | 209 | — |
| Example 9 | — | — | — | — | — | — |
| Comparative Example 4 | 209 | 1 | 3.11 | 1 | — | addition until pH 13 |

TABLE 2

| | (A) Hypochbrite ion (HClO and ClO−) (mass %) | Effective chlorine concentration (mass %) | (B1) Akylammonium ion (TMA+) (mass %) | Sodium ion concentration (mass %) | (C) Solvent (water) (mass %) |
|---|---|---|---|---|---|
| Example 1 | 2.15 | 2.96 | 3.09 | ≤500 ppb | 94.76 |
| Example 2 | 2.9 | 4.00 | 4.17 | ≤500 ppb | 92.93 |
| Example 3 | 1.45 | 2.00 | 2.08 | ≤500 ppb | 96.47 |
| Example 4 | 2.15 | 2.96 | 2.35 | ≤500 ppb | 95.50 |
| Example 5 | 2.15 | 2.96 | 3.10 | ≤500 ppb | 94.75 |
| Example 6 | 0.32 | 0.44 | 0.46 | ≤500 ppb | 99.22 |
| Example 7 | 5.8 | 7.99 | 8.33 | ≤500 ppb | 85.87 |
| Comparative Example 1 | 2.15 | 2.96 | 0.10 | ≤500 ppb | 97.75 |
| Comparative Example 2 | 2.15 | 2.96 | 0.01 | ≤500 ppb | 97.84 |
| Example 8 | 7.25 | 9.99 | 10.42 | ≤500 ppb | 82.33 |
| Comparative Example 3 | 2.15 | 2.96 | 0.001 | ≤500 ppb | 97.85 |
| Example 9 | 2.15 | 2.96 | — | 0.96 | 96.89 |
| Comparative Example 4 | 2.15 | 2.96 | 3.10 | ≤500 ppb | 94.75 |

TABLE 3

| | pH (25° C.) | Etching properties | | | | Residual of foreign matter | | Remaining Na after cleaning (atoms/cm$^2$) | Storage stability |
|---|---|---|---|---|---|---|---|---|---|
| | | Etching speed (nm/min) | | | | | | | |
| | | Ru (23° C.) | Ru (65° C.) | W (23° C.) | W (65° C.) | 23° C. | 65° C. | | |
| Example 1 | 10.0 | 20 | 75 | >120 | >120 | A | A | A | A |
| Example 2 | 10.0 | 72 | >120 | >120 | >120 | A | A | A | A |
| Example 3 | 10.0 | 10.6 | >120 | >120 | >120 | A | A | A | A |
| Example 4 | 8.0 | 90 | >120 | >120 | >120 | A | A | A | A |
| Example 5 | 11.5 | 1.8 | 30 | 30 | >120 | — | A | A | A |
| Example 6 | 10.0 | 5.6 | 10.8 | 70 | >120 | A | A | A | A |
| Example 7 | 10.0 | >120 | >120 | >120 | >120 | A | A | A | A |
| Comparative Example 1 | 6.0 | 71 | >120 | 20 | 40 | B | B | A | B |
| Comparative Example 2 | 5.0 | 52 | >120 | 15 | 30 | B | B | A | B |
| Example 8 | 10.0 | >120 | >120 | >120 | >120 | A | A | A | B |
| Comparative Example 3 | 4.0 | 23 | >120 | <1 | <1 | B | B | A | B |
| Example 9 | 11.0 | 57 | >120 | >120 | >120 | A | A | C | A |
| Comparative Example 4 | 13.0 | 0.2 | 0.4 | 2 | 30 | — | — | A | A |

As shown in Table 3, it was confirmed that the treatment liquid of the present embodiment had a high etching speed of ruthenium and tungsten, was effective in removal of the metals, and had no foreign matter remaining. The treatment liquids of Examples 5 and 6 had a low etching speed at 23° C., but by raising an etching temperature, it was confirmed that the etching speed can be improved, and the treatment liquids can be used in practice without any problem. Since the treatment liquid of Example 9 has many Na ions, the amount of Na remaining after cleaning is large, but such residual Na can be sufficiently reduced by repeated cleaning. The treatment liquid of the present embodiment is excellent in storage stability. Further, it was confirmed that etching properties of the treatment liquid of the present embodiment to Si which is a main material of the semiconductor wafer and a Si-containing coating film ($SiO_2$, $Si_3N_4$) generated during circuit formation were evaluated to be 0.1 nm/min or less in all cases, and ruthenium and tungsten to be removed can be efficiently etched.

The treatment liquids of Comparative Examples 1, 2, and 3 have low pH and a low etching speed. After the etching, residual of the foreign matter was observed, and the storage stability was low.

In Comparative Example 4, since the pH is higher than 12, it is known that even when the treatment is performed at 23° C. and 65° C., the etching speed to ruthenium adhering to the edge surface portion and the back surface portion of the semiconductor wafer was insufficient.

Example 10

Acetonitrile was added to the treatment liquid obtained in Example 2 to obtain a treatment liquid having composition described in Table 4. The pH of the treatment liquid and the etching speed at 23° C. to the Ru coating film were evaluated. The results are shown in Table 4.

Example 11

Sulfolane was added to the treatment liquid obtained in Example 2 to obtain a treatment liquid having composition described in Table 4. The pH of the treatment liquid and the etching speed at 23° C. to the Ru coating film were evaluated. The results are shown in Table 4.

TABLE 4

| | (A) Hypochbrite ion (HClO and ClO$^-$) (mass %) | Effective chlorine concentration (mass %) | (B1) Akyl ammonium ion (TMA$^+$) (mass %) | Sodium ion concentration (mass %) | (C) Solvent | | | pH (25° C.) | Ru etching speed (23° C.) (nm/min) |
|---|---|---|---|---|---|---|---|---|---|
| | | | | | Organic solvent | | | | |
| | | | | | Kind | Amount (mass %) | Water (mass %) | | |
| Example 10 | 2.34 | 3.22 | 3.36 | ≤500 ppb | acetonitrile | 24.12 | 70.18 | 10.7 | 20 |
| Example 11 | 2.34 | 3.22 | 3.36 | ≤500 ppb | sulfolane | 24.12 | 70.18 | 10.3 | 52 |

The treatment liquids of Examples 10 and 11 have the same composition as Example 2 except that water and an organic solvent are used in combination as a solvent. The Ru etching speed varied depending on the kind of the organic solvent. It was found that the Ru etching speed decreased by using acetonitrile and sulfolane.

Example 12

(Manufacture of Treatment Liquid)
<Pre-Treatment of Ion Exchange Resin to Prepare Hydrogen Type Ion Exchange Resin>
As the weakly acidic ion exchange resin, an acrylic DIAION™ (manufactured by Mitsubishi Chemical Corporation, WK 40 L) was packed in a column, and a sodium hypochlorite solution prepared so as to have a predetermined hypochlorite ion concentration was passed through the column to obtain a treatment liquid shown in Table 5. Specifically, in a case of the treatment liquid shown in Example 12, an ion exchange resin having an ion exchange capacity equivalent to 1.3 mmol/L of Na ions was packed in a column, and a 3% aqueous sodium hypochlorite solution passed through the column to obtain the treatment liquid.

Further, by confirming the pH of the treatment liquid after passing, it can be confirmed whether the ion exchange sufficiently proceeded, and in a case of insufficient ion exchange, a treatment liquid was repeatedly passed through the column until the pH reduced to predetermined level. In accordance with the concentration of sodium to be realized, an area for contacting the ion exchange resin with the aqueous sodium hypochlorite solution was adjusted to obtain the treatment liquid shown in Table 5.

<Evaluation>

The pH, hypochlorite ion concentration of the obtained treatment liquid, sodium ion concentration, ruthenium etching speed at 23° C., residual of foreign matter, "sodium concentration remaining on the cleaning surface of the wafer", and storage stability of the obtained treatment liquid were evaluated. The results are shown in Table 5. The etching speed of ruthenium of 10 nm/min or more was ranked as good (A), and the etching speed of 5 nm/min or more and less than 10 nm/min was ranked as fair (B).

Example 13

The same operation as in Example 12 was repeated except that an ion exchange resin having an ion exchange capacity equivalent to 1.2 mmol/L of Na was packed in a column to obtain a treatment liquid having the composition described in Table 5. The results are shown in Table 5.

Example 14

The same operation as in Example 12 was repeated except that an ion exchange resin having an ion exchange capacity equivalent to having 6.5 mmol/L of Na ions was packed in a column and a 2% aqueous sodium hypochlorite solution passed through the column to obtain a treatment liquid having the composition described in Table 5. The results are shown in Table 5.

Example 15

The same operation as in Example 12 was repeated except that an ion exchange resin having an ion exchange capacity equivalent to 1.6 mmol/L of Na ions was packed in a column and a 4% aqueous sodium hypochlorite solution passed through the column to obtain a treatment liquid having the composition described in Table 5. The results are shown in Table 5.

Comparative Example 5

The same operation as in Example 12 was repeated except that an ion exchange resin having an ion exchange capacity equivalent to 290 mmol/L of Na ions was packed in a column to obtain a treatment liquid having the composition described in Table 5. The results are shown in Table 5.

Comparative Example 6

The same operation as in Example 12 was repeated except that an ion exchange resin having an ion exchange capacity equivalent to 287 mmol/L of Na ions was packed in a column to obtain a treatment liquid having the composition described in Table 5. The results are shown in Table 5.

Comparative Example 7

The same operation as in Example 12 was repeated except that the solution is brought into contact with the ion exchange resin until the concentration of the sodium ion contained in the treatment liquid was 10 ppb or less to obtain a treatment liquid having the composition described in Table 5. The results are shown in Table 5.

Example 16

The same operation as in Example 12 was repeated except that an ion exchange resin having an ion exchange capacity equivalent to 3.4 mmol/L of Na ions was packed in a column and a 8% aqueous sodium hypochlorite solution passed through the column to obtain a treatment liquid having the composition described in Table 5. The results are shown in Table 5.

TABLE 5

| | (A) Hypochlorite ion (HClO and ClO$^-$) (mass %) | (B2)Sodium ion concentration (ppm) [mass basis] | (C) Solvent (water) (mass %) | pH (25° C.) | Ru etching speed (23° C.) (nm/min) | Residual of foreign matter | Remaining Na after cleaning (atoms/cm$^2$) | Storage stability |
|---|---|---|---|---|---|---|---|---|
| Example 12 | 2.07 | 9300 | 97.00 | 10 | 83 | A | B | A |
| Example 13 | 2.07 | 9000 | 97.03 | 9 | 104 | A | B | A |
| Example 14 | 1.38 | 4300 | 98.19 | 8 | 67 | A | B | A |
| Example 15 | 2.76 | 12000 | 96.04 | 9 | >120 | A | B | A |
| Comparative Example 5 | 2.07 | 300 | 97.90 | 6 | 92 | B | A | B |
| Comparative Example 6 | 2.07 | 30 | 97.93 | 5 | 61 | B | A | B |
| Comparative Example 7 | 2.07 | ≤10 ppb | 97.93 | 3 | 13 | A | A | B |
| Example 16 | 5.53 | 25000 | 91.97 | 10 | >120 | A | C | A |

As shown in Table 5, the treatment liquids of Examples 12 to 15 can perform a treatment in which the etching speed of ruthenium is high and the amount of sodium remaining after cleaning is small, and storage stability is also excellent.

In the treatment liquids of Comparative Examples 5 and 6, residual of foreign matter was confirmed. In Comparative Example 7, since the pH was as low as 3.0 and there was few counter ions of the hypochlorite ion, the storage stability decreased.

In Example 16, it was confirmed that the etching speed of ruthenium was good and can be used in practice without any problem. Since the treatment liquid of Example 16 has many Na ions, the amount of Na remaining after cleaning is large, but such residual Na can be sufficiently reduced by repeated cleaning.

REFERENCE SIGNS LIST

1 Semiconductor wafer
2 Ruthenium and/or tungsten
3 Edge surface portion
4 Back surface portion

The invention claimed is:

1. A treatment liquid for cleaning a semiconductor wafer, comprising:
   (A) a hypochlorite ion;
   (B1) an alkyl ammonium ion; and
   (C) a solvent, wherein
   a concentration of the (A) hypochlorite ion is 0.05 mass % to 6 mass %, and pH at 25° C. is more than 7 and less than 12.0.

2. The treatment liquid according to claim 1, wherein a concentration of the (A) hypochlorite ion is 0.1 mass % to 6 mass %.

3. The treatment liquid according to claim 2, wherein a concentration of the (A) hypochlorite ion is 0.3 mass % to 6 mass %.

4. A treatment liquid for cleaning a semiconductor wafer, comprising:
   (A) a hypochlorite ion;
   (B1) an alkyl ammonium ion; and
   (C) a solvent, wherein
   the solvent (C) contains an organic solvent, and pH at 25° C. is 8 or more and less than 12.0.

5. The treatment liquid according to claim 4, wherein a concentration of the (A) hypochlorite ion is 0.05 mass % to 20.0 mass %.

6. The treatment liquid according to claim 1, wherein the (B1) alkyl ammonium ion is a quaternary alkyl ammonium ion.

7. The treatment liquid according to claim 4, wherein the (B1) alkyl ammonium ion is a quaternary alkyl ammonium ion.

8. A method for cleaning a semiconductor wafer, wherein the treatment liquid according to claim 1 is brought into contact with the semiconductor wafer.

9. A method for cleaning a semiconductor wafer, wherein the treatment liquid according to claim 4 is brought into contact with the semiconductor wafer.

10. The method for cleaning a semiconductor wafer according to claim 8, wherein the semiconductor wafer has at least one metal selected from the group consisting of ruthenium and tungsten on a surface thereof, and the method includes a step of removing the metal.

11. The method for cleaning a semiconductor wafer according to claim 9, wherein the semiconductor wafer has at least one metal selected from the group consisting of ruthenium and tungsten on a surface thereof, and the method includes a step of removing the metal.

12. A method for manufacturing the treatment liquid according to claim 1, comprising:
   (a) preparing an ion exchange resin to which alkyl ammonium is added; and
   (b) bringing the ion exchange resin to which the alkyl ammonium is added into contact with an aqueous solution containing a hypochlorite ion.

13. A method for manufacturing the treatment liquid according to claim 4, comprising:
   (a) preparing an ion exchange resin to which alkyl ammonium is added; and
   (b) bringing the ion exchange resin to which the alkyl ammonium is added into contact with an aqueous solution containing a hypochlorite ion.

14. The method for manufacturing the treatment liquid according to claim 12, comprising (c) adjusting pH after (b).

15. The method for manufacturing the treatment liquid according to claim 13, comprising (c) adjusting pH after (b).

* * * * *